(12) United States Patent
Wang et al.

(10) Patent No.: US 8,605,187 B2
(45) Date of Patent: *Dec. 10, 2013

(54) CCD IMAGE SENSORS HAVING MULTIPLE LATERAL OVERFLOW DRAIN REGIONS FOR A HORIZONTAL SHIFT REGISTER

(75) Inventors: Shen Wang, Webster, NY (US); Eric J. Meisenzahl, Ontario, NY (US); David N. Nichols, Fairport, NY (US)

(73) Assignee: Truesense Imaging, Inc., Rochester, NY (US)

( * ) Notice: Subject to any disclaimer, the term of this patent is extended or adjusted under 35 U.S.C. 154(b) by 463 days.

This patent is subject to a terminal disclaimer.

(21) Appl. No.: 12/475,825

(22) Filed: Jun. 1, 2009

(65) Prior Publication Data
US 2010/0302427 A1 Dec. 2, 2010

(51) Int. Cl.
*H01L 27/15* (2006.01)
*H04N 5/335* (2011.01)

(52) U.S. Cl.
USPC ............................ 348/314; 348/311; 257/230

(58) Field of Classification Search
USPC .................. 348/294, 311, 314–315; 257/230
See application file for complete search history.

(56) References Cited

U.S. PATENT DOCUMENTS

| | | | | | |
|---|---|---|---|---|---|
| 4,910,568 | A | * | 3/1990 | Takei et al. ................... | 257/222 |
| 5,130,774 | A | * | 7/1992 | Stevens et al. ................ | 348/314 |
| 5,283,450 | A | * | 2/1994 | Harada ........................ | 257/223 |
| 5,326,997 | A | * | 7/1994 | Nakanishi .................... | 257/230 |
| 5,902,995 | A | * | 5/1999 | Morimoto .................. | 250/208.1 |
| 6,760,073 | B1 | * | 7/2004 | Nakashiba ................... | 348/314 |

FOREIGN PATENT DOCUMENTS

| | | |
|---|---|---|
| EP | 0 509 456 A1 | 10/1992 |
| EP | 1 137 070 A2 | 9/2001 |
| WO | WO 2008081997 A2 * | 7/2008 ............ H01L 27/148 |

* cited by examiner

*Primary Examiner* — Zachary Wilkes
(74) *Attorney, Agent, or Firm* — Howard & Howard Attorneys PLLC

(57) ABSTRACT

A charge-coupled device (CCD) image sensor includes a layer of a semiconductor material having a first conductivity type. A horizontal CCD channel region of a second conductivity type is disposed in the layer of the semiconductor material. The horizontal CCD channel region includes multiple phases that are used to shift photo-generated charge through the horizontal CCD channel region. Distinct overflow drain regions are disposed in the layer of semiconducting material, with an overflow drain region electrically connected to only one particular phase of the horizontal CCD channel region. A buffer region of the second conductivity type can be used to electrically connect each overflow drain to the one particular phase of the horizontal CCD channel. Multiple barrier regions are disposed in the layer of semiconductor material, with each barrier region disposed between each overflow drain and the one particular phase electrically connected to the drain.

25 Claims, 3 Drawing Sheets

CCD IMAGE SENSORS HAVING MULTIPLE LATERAL OVERFLOW DRAIN REGIONS FOR A HORIZONTAL SHIFT REGISTER

CROSS-REFERENCE TO RELATED APPLICATION

This application is related to U.S. patent application Ser. No. 12/609,029 filed on Oct. 30, 2009.

TECHNICAL FIELD

The present invention relates generally to image sensors for use in digital cameras and other types of image capture devices, and more particularly to image sensors having multiple lateral overflow drain structures for a horizontal shift register.

BACKGROUND

There are several different types of image sensors. An area image sensor, such as an interline charge-coupled device (CCD) image sensor, has at least a 2×2 array of photodetectors, a mechanism to transfer photo-generated charge from the photodetectors to vertical shift registers, and a mechanism to shift the photo-generated charge vertically through the vertical shift registers to a horizontal shift register. The charge in the horizontal shift register is then shifted horizontally to an output amplifier that is connected to external circuitry that converts the photo-generated charge to an image.

A full frame CCD image sensor is also an area image sensor. One difference between a full frame CCD image sensor and an interline CCD image sensor is that the photodetectors in a full frame CCD sensor also function as vertical shift registers.

A linear image sensor has only one line of photodetectors for each color channel including monochrome. A linear image sensor does not have any vertical shift registers. The photo-generated charge is transferred directly from the photodetectors to a horizontal shift register.

Photodetectors, vertical shift registers, and horizontal shift registers all have a maximum amount of photo-generated charge each can store. Excess charge spills or "blooms" into neighboring components when the photo-generated charge exceeds the maximum amount. Blooming is a serious problem in image sensors because blooming corrupts the image output from the image sensor.

A camera having an image sensor operating in either a sub-sampling mode or a focus mode can transfer excess photo-generated charge to a horizontal shift register. A sub-sampling mode enables a camera to operate with a fast frame rate having less resolution, such as a video preview mode. For example, a "5×" sub-sampling in the y-direction reads out only one line out of every five lines. The image sensor inside the camera dumps four successive lines of charge from the vertical shift registers into the horizontal shift register and removes the charge from the horizontal shift register before the transfer of the fifth line of charge. If the amount of photo-generated charge in the four lines of charge exceeds the capacity of the horizontal shift register, the excess charge spills back into the vertical shift registers and creates a "blooming" image.

A focus-mode enables the image sensor to read out only a portion of the image by dumping the leading and trailing portions of the image. The leading or the trailing portions can include many lines of charge. Blooming occurs when the total amount of charge dumped into the horizontal shift register exceeds the capacity of the horizontal shift register. Blooming corrupts the image and adversely affects the auto-focusing functionality of the camera.

U.S. Pat. No. 5,902,995 discloses a solution to the problem of blooming in the horizontal shift register. FIG. 1 depicts a top view of a portion of an image sensor disclosed in U.S. Pat. No. 5,902,995. Image sensor 100 has array of photodetectors 102 that convert incident light into photo-generated charge. Each pixel has four vertical gates 104, 106, 108, 110 that are used to shift photo-generated charge through the vertical shift register regions 111. Each horizontal shift register region 112 also has four gates 114, 116, 118, 120 that are used to sequentially shift the photo-generated charge through the horizontal shift register region.

Photo-generated charge that is transferred to the vertical shift register regions 111 is shifted vertically down through a channel 124 in each vertical shift register region 111, and then transferred to the horizontal shift register region 112. An overflow barrier region 128 extends across and is embedded below channel 126. An overflow drain region 130 is connected to channel 126 of horizontal shift register region 112. Overflow drain region 130 discharges any excess charge that exceeds the barrier potential.

However, due to relatively high sheet resistance of overflow drain region 130, having a long stripe of an overflow drain region 130 extending across the entire horizontal shift register region 112 produces a voltage drop from the center of the stripe to the point where the stripe has a conductive contact that connects to a power supply. This voltage drop degrades the effectiveness of the overflow drain performance.

To overcome the drop in voltage, the overflow drain under each horizontal gate should be connected to a metal bus to eliminate the voltage drop caused by the conductive contact. However, this solution is not feasible when the length of a horizontal gate (L1 or L2) is too small to accommodate a conductive contact.

SUMMARY

A charge-coupled device (CCD) image sensor includes a layer of a semiconductor material of one conductivity type and having a surface. A horizontal CCD channel region of the opposite conductivity type is disposed adjacent to the surface of the layer of the semiconductor material. The horizontal CCD channel region includes a plurality of phases that is used to shift photo-generated charge through the horizontal CCD channel region. Distinct overflow drain regions are disposed in the layer of semiconducting material, with an overflow drain region electrically connected to only one particular phase of the horizontal CCD channel region. A plurality of barrier regions is disposed in the layer of semiconductor material, with each barrier region disposed between each overflow drain region and the one particular phase electrically connected to the overflow drain region. In one embodiment in accordance with the invention, a buffer region of the second conductivity type electrically connects each overflow drain to the one particular phase of the horizontal CCD channel.

ADVANTAGES

The present invention can reduce or prevent blooming in horizontal CCD channel regions. The present invention can reduce the vertical size of an image sensor. The smaller size of the image sensor reduces the costs to manufacture the image sensor. Furthermore, the present invention can be used to reduce the "pull-down" effect of channel potential in an overflow barrier region, thereby making the overflow barrier region electrically more stable.

BRIEF DESCRIPTION OF THE DRAWINGS

Embodiments of the invention are better understood with reference to the following drawings. The elements of the drawings are not necessarily to scale relative to each other.

DETAILED DESCRIPTION

Figure 1:
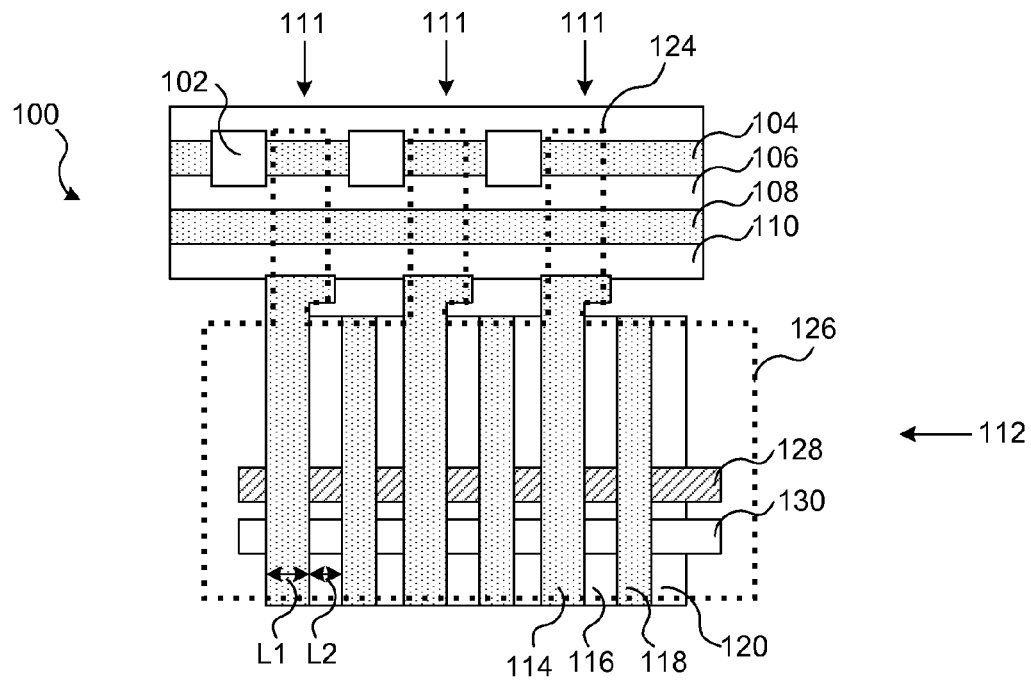
FIG. 1 is a top view of a portion of a prior art image sensor.

Throughout the specification and claims the following terms take the meanings explicitly associated herein, unless the context clearly dictates otherwise. The meaning of "a," "an," and "the" includes plural reference, the meaning of "in" includes "in" and "on." The term "connected" means either a direct electrical connection between the items connected or an indirect connection through one or more passive or active intermediary devices. The term "circuit" means either a single component or a multiplicity of components, either active or passive, that are connected together to provide a desired function. The term "signal" means at least one current, voltage, or data signal.

Additionally, directional terms such as "on", "over", "top", "bottom", are used with reference to the orientation of the Figure(s) being described. Because components of embodiments of the present invention can be positioned in a number of different orientations, the directional terminology is used for purposes of illustration only and is in no way limiting. When used in conjunction with layers of an image sensor wafer or corresponding image sensor, the directional terminology is intended to be construed broadly, and therefore should not be interpreted to preclude the presence of one or more intervening layers or other intervening image sensor features or elements. Thus, a given layer that is described herein as being formed on or formed over another layer may be separated from the latter layer by one or more additional layers.

And finally, the terms "wafer" and "substrate" are to be understood as a semiconductor-based material including, but not limited to, silicon, silicon-on-insulator (SOI) technology, doped and undoped semiconductors, epitaxial layers formed on a semiconductor substrate, and other semiconductor structures.

Referring to the drawings, like numbers indicate like parts throughout the views.

Figure 2:
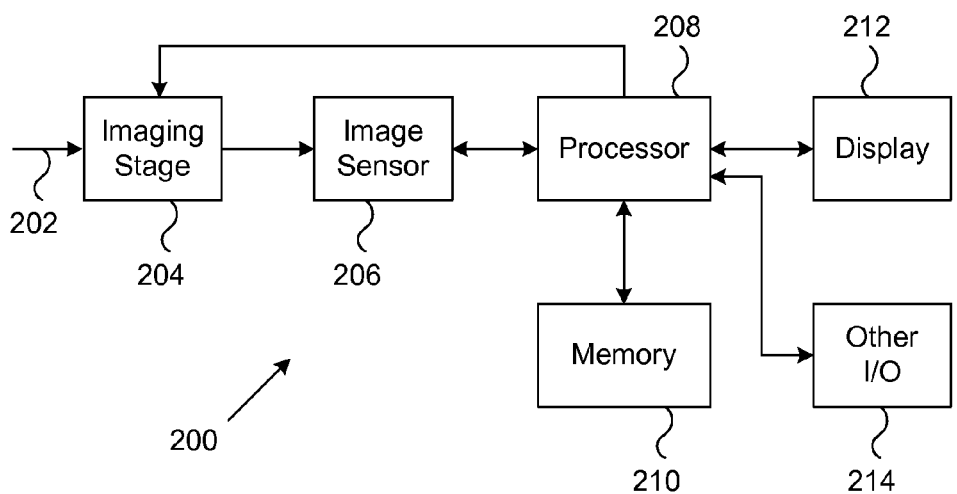
FIG. 2 is a simplified block diagram of an image capture device in an embodiment in accordance with the invention.

FIG. 2 is a simplified block diagram of an image capture device in an embodiment in accordance with the invention. Image capture device 200 is implemented as a digital camera in FIG. 2. Those skilled in the art will recognize that a digital camera is only one example of an image capture device that can utilize an image sensor incorporating the present invention. Other types of image capture devices, such as, for example, cell phone cameras, scanners, and digital video camcorders, can be used with the present invention.

In digital camera 200, light 202 from a subject scene is input to an imaging stage 204. Imaging stage 204 can include conventional elements such as a lens, a neutral density filter, an iris and a shutter. Light 202 is focused by imaging stage 204 to form an image on image sensor 206. Image sensor 206 captures one or more images by converting the incident light into electrical signals. Image sensor 206 is implemented as a Charge-Coupled Device (CCD) image sensor in the embodiment shown in FIG. 2.

Digital camera 200 further includes processor 208, memory 210, display 212, and one or more additional input/output (I/O) elements 214. Although shown as separate elements in the embodiment of FIG. 2, imaging stage 204 may be integrated with image sensor 206, and possibly one or more additional elements of digital camera 200, to form a compact camera module.

Processor 208 may be implemented, for example, as a microprocessor, a central processing unit (CPU), an application-specific integrated circuit (ASIC), a digital signal processor (DSP), or other processing device, or combinations of multiple such devices. Various elements of imaging stage 204 and image sensor 206 may be controlled by timing signals or other signals supplied from processor 208.

Memory 210 may be configured as any type of memory, such as, for example, random access memory (RAM), read-only memory (ROM), Flash memory, disk-based memory, removable memory, or other types of storage elements, in any combination. A given image captured by image sensor 206 may be stored by processor 208 in memory 210 and presented on display 212. Display 212 is typically an active matrix color liquid crystal display (LCD), although other types of displays may be used. The additional I/O elements 214 may include, for example, various on-screen controls, buttons or other user interfaces, network interfaces, or memory card interfaces.

It is to be appreciated that the digital camera shown in FIG. 2 may comprise additional or alternative elements of a type known to those skilled in the art. Elements not specifically shown or described herein may be selected from those known in the art. As noted previously, the present invention may be implemented in a wide variety of image capture devices. Also, certain aspects of the embodiments described herein may be implemented at least in part in the form of software executed by one or more processing elements of an image capture device. Such software can be implemented in a straightforward manner given the teachings provided herein, as will be appreciated by those skilled in the art.

Figure 3:
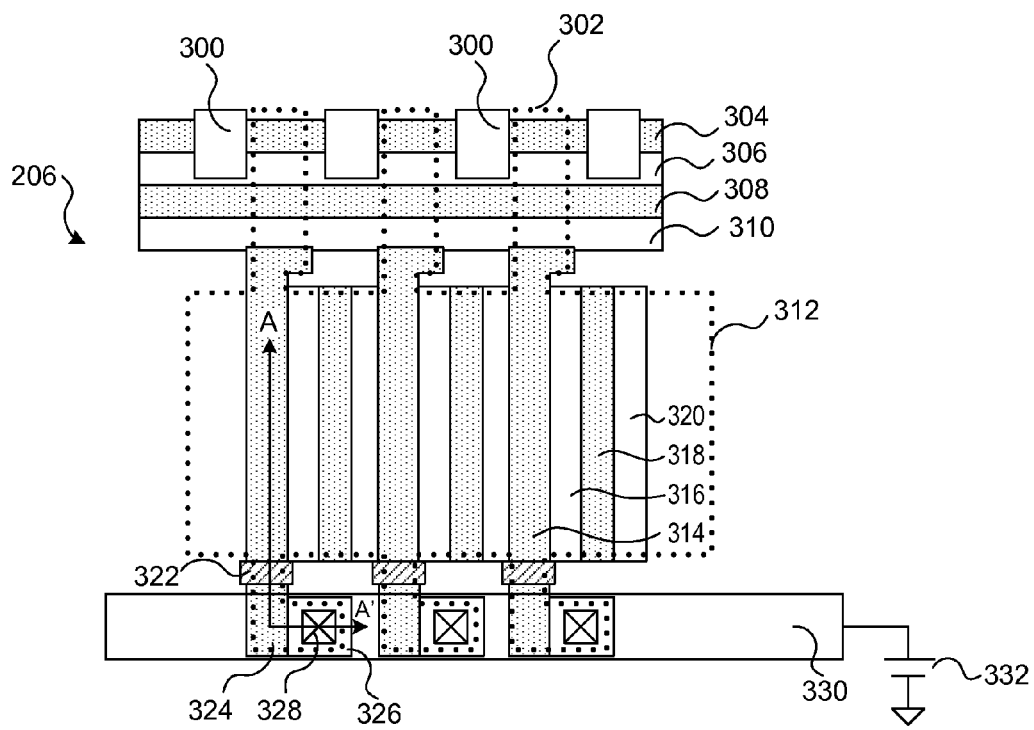
FIG. 3 is a simplified top view of image sensor 206 shown in FIG. 2 in an embodiment in accordance with the invention.

Referring now to FIG. 3, there is shown a simplified top view of image sensor 206 shown in FIG. 2 in an embodiment in accordance with the invention. Image sensor 206 has array of pixels with each pixel including a photodetector 300 to convert incident light into photo-generated charge. For simplicity, only a portion of the last row of pixels in the array is shown in FIG. 3.

A vertical gate 304, 306, 308, 310 is disposed over each phase (not shown) of vertical CCD channel region 302. Gates 304 and 308 are made by a first layer of conductive material, such as, for example, a polysilicon material. Gates 306 and 310 are made by a second layer of conductive material.

Horizontal CCD channel region 312 also has four gates 314, 316, 318, 320. Each gate 314, 316, 318, 320 is disposed over a phase (not shown in FIG. 3) of horizontal CCD channel 312. Horizontal gates 314 and 318 are made by the first conductive material and horizontal gates 316 and 320 are made by the second conductive material.

Figure 4:
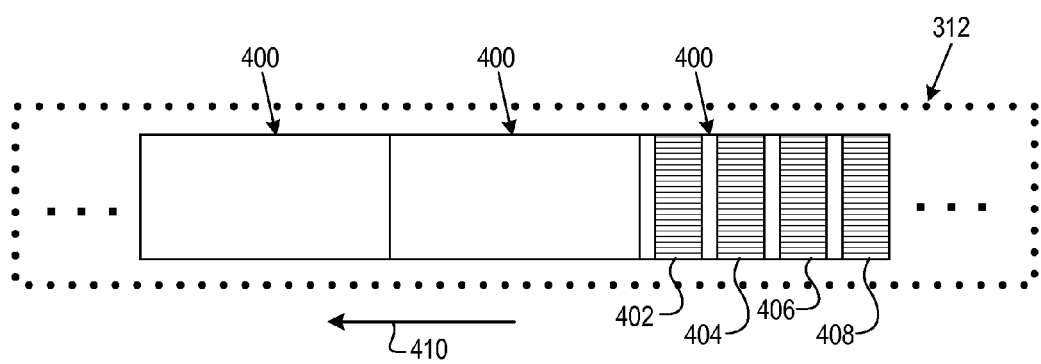
FIG. 4 is a simplified diagram of four phases that may be included in vertical CCD channel region 302 in an embodiment in accordance with the invention.

FIG. 4 is a simplified diagram of four phases that can be used in horizontal CCD channel region 312 in an embodiment in accordance with the invention. Other embodiments in accordance with the invention can employ any number of phases in a horizontal CCD channel region, such as, for example, two or more phases.

When a horizontal CCD channel region is configured as a multi-phase structure, each shift element 400 in the horizontal CCD channel region is separated into multiple parts or "phases." The phases facilitate the transfer of charge through the structures. Thus, in a four-phase CCD, each shift element 400 has a first phase 402, a second phase 404, a third phase 406, and a fourth phase 408. Horizontal gate 314 (FIG. 3) is disposed over first phase 402, horizontal gate 316 over second phase 404, horizontal gate 318 over third phase 406, and horizontal gate 320 over fourth phase 408. Arrow 410 represents the direction photo-generated charge is shifted through horizontal CCD channel region 312 in an embodiment in accordance with the invention.

Referring again to FIG. 3, after the photodetectors 300 convert the incident light into photo-generated charge, the photo-generated charge is transferred from the photodetectors 300 to the first phase in each vertical CCD channel region 302. The photo-generated charge is then shifted down through the phases of vertical CCD channel region 302 by selectively applying clock signals to vertical gates 304, 306, 308, 310.

The last phase of vertical CCD channel region 302 transfers the photo-generated charge into horizontal CCD channel region 312. Clocking signals are then selectively applied to horizontal gates 314, 316, 318, 320 to sequentially shift the photo-generated charge through the phases 402, 404, 406, 408 (FIG. 4) in horizontal CCD channel region 312.

An overflow barrier region 322 is disposed adjacent to only one phase in horizontal CCD channel region 312. In the embodiment shown in FIG. 3, overflow barrier region 322 is adjacent to the phase that receives the photo-generated charge from vertical CCD channel region 302. Other embodiments in accordance with the invention can place overflow barrier region 322 adjacent to another phase in horizontal CCD channel region 312.

A buffer region 324 is disposed adjacent to each barrier region 322. An overflow drain 326 is formed sideways or laterally adjacent to each buffer region 324. A conductive contact 328 connects each overflow drain region 326 to a conductive bus 330. Conductive bus 330 is implemented as a metal bus in an embodiment in accordance with the invention. Examples of metal materials that can be used for conductive bus 330 include, but are not limited to, aluminum and copper. Conductive bus 330 can be formed with a different conductive material in another embodiment in accordance with the invention.

Conductive bus 330 connects to a power supply bias 332. Power supply bias 332 is implemented as a DC bias in the embodiment shown in FIG. 3. Other embodiments in accordance with the invention can configure power supply bias using different components or circuits. For example, power supply bias 332 can be connected to an existing DC bias, such as the drain of a reset transistor or the output amplifier supply VDD.

When the photo-generated charge does not exceed the charge capacity of one or more phases in horizontal CCD channel region 312, the photo-generated charge is shifted through horizontal CCD channel region 312 by applying clock signals to horizontal gates 314, 316, 318, 320. However, if the photo-generated charge exceeds the capacity of the phase clocked by horizontal gate 314, as can happen when image sensor 206 is operating in either a sub-sampling or a focus mode, the excess charge will flow over overflow barrier region 322, pass through buffer region 324, and be drained away by overflow drain region 326.

Connecting conductive contact 328 to the conductive bus 330 at only one of every four horizontal gates eliminates the voltage drop problem experienced by prior art image sensors. Also, unlike the prior art in which the overflow drain region is placed under each horizontal gate, the overflow drain region is connected to only one of the four phases, thereby enabling conductive contact 328 to be placed between conductive bus 330 and overflow drain region 326. In addition, each overflow drain region can be placed sideways or laterally adjacent to each buffer region 324, thereby reducing the vertical size of image sensor 206. The smaller size of image sensor 206 results in less manufacturing costs. Furthermore, the buffer region 324 can be used to reduce the "pull-down" effect of channel potential in overflow barrier region 322 by the overflow drain region 326, thereby making overflow barrier region 322 more stable.

Figure 5:
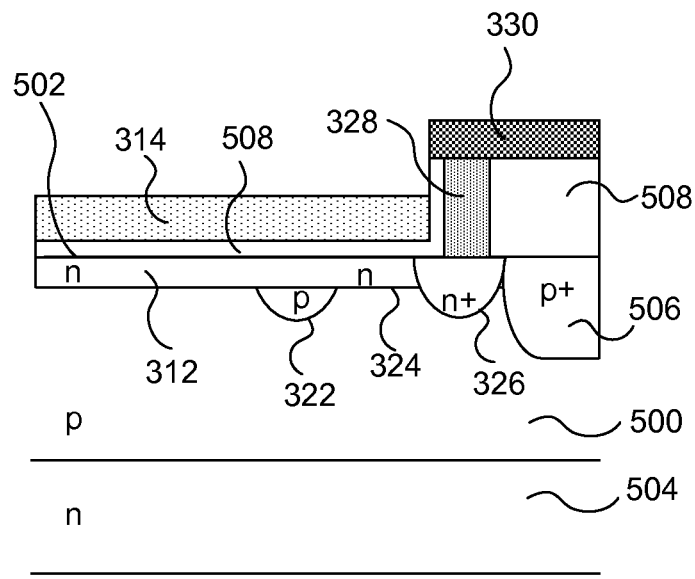
FIG. 5 is a cross-sectional view along line A-A' shown in FIG. 3.

FIG. 5 is a cross-sectional view along line A-A' shown in FIG. 3. Some of the elements shown in FIG. 5 are described herein as having specific conductivity types. Other embodiments in accordance with the invention are not limited to these conductivity types. For example, all of the conductivity types may be reversed in another embodiment in accordance with the invention.

A well 500 having a surface 502 is formed by implanting one or more dopants having a p conductivity type into substrate 504 having an n conductivity type. Well 500 spans the area in the image sensor that includes all of the photodetectors, vertical CCD channel regions, and horizontal CCD channel region in an embodiment in accordance with the invention. Well 500 and substrate 504 each comprise a layer of semiconductor material.

Channel stop region 506 is formed adjacent to surface 502 by implanting at least one dopant having a p+ conductivity type into well 500. Field oxide 508 is then grown and forms an isolation region. Different types of isolation regions can be used in other embodiments in accordance with the invention.

Horizontal CCD channel region 312 and buffer region 324 are then fabricated adjacent to surface 502 by implanting one or more dopants having an n conductivity type into well 500. Overflow barrier region 322 is formed by implanting at least one dopant having a p conductivity type into well 500. Overflow barrier region 322 is embedded in, or wholly contained within, well 500. Overflow barrier region 322 is also disposed below horizontal gate 314.

The first conductive material is then deposited and patterned over horizontal CCD channel region 312 to form horizontal gates 314, 318 (gate 318 not shown in FIG. 5). Next, the second conductive material is deposited and patterned to form horizontal gates 316, 320 (gates not shown in FIG. 5). A polysilicon material is used as the first and second conductive materials in an embodiment in accordance with the invention.

Overflow drain region 326 is then formed adjacent to surface 502 by implanting one or more dopants having an n+ conductivity type into well 500. Conductive contact 328 is formed and connected to conductive bus 330. Conductive contact 328 and conductive bus 330 are formed by depositing and patterning metal layers in an embodiment in accordance with the invention. Finally, conductive bus 330 is connected to a power supply bias (not shown in FIG. 3) to set the potential of overflow drain region 326.

Boron is an exemplary dopant having a p conductivity type that can be used to form the p conductivity type structures. Phosphorus and arsenic are exemplary dopants having an n conductivity type that can be used to form the n conductivity type structures.

Figure 6:
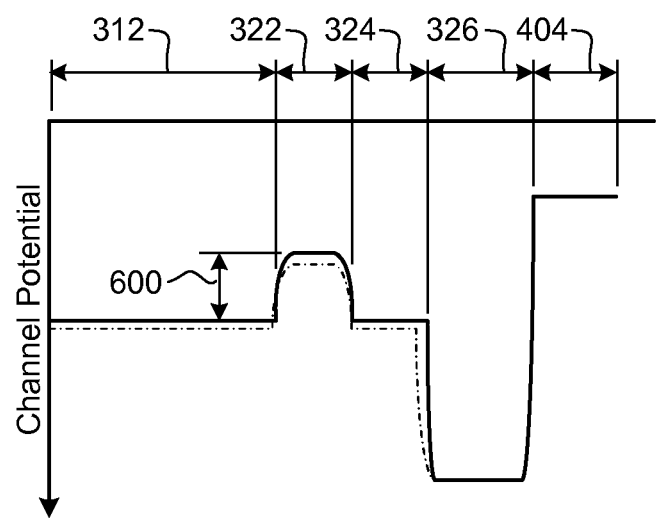
FIG. 6 is an exemplary channel potential diagram along line A-A' shown in FIG. 3.

Referring now to FIG. 6, there is shown an exemplary channel potential diagram along line A-A' shown in FIG. 2. Barrier height 600 determines how much photo-generated charge a horizontal CCD channel region can hold before the photo-generated charge exceeds the capacity of the horizontal CCD channel region. When the photo-generated charge exceeds the charge capacity of the horizontal CCD channel region, the excess photo-generated charge flows over overflow barrier region 322 and is drained away by overflow drain region 326. Buffer region 324 reduces the fluctuations in the channel potential (represented by dashed line) caused by process variations during fabrication of the image sensor.

The invention has been described in detail with particular reference to certain preferred embodiments thereof, but it will be understood that variations and modifications can be effected within the spirit and scope of the invention. For example, the embodiments described herein employ only one horizontal CCD channel region in an image sensor. Other embodiments in accordance with the invention can use two or more horizontal CCD channel regions. The horizontal CCD channel region or regions can be positioned at any location around the array of pixels. And the horizontal CCD channel region or regions can be uni-directional and transfer photo-generated charge in only one direction, or bi-directional and simultaneously transfer photo-generated charge in two opposite directions.

Additionally, even though specific embodiments of the invention have been described herein, it should be noted that the application is not limited to these embodiments. In particular, any features described with respect to one embodiment may also be used in other embodiments, where compatible. And the features of the different embodiments may be exchanged, where compatible.

PARTS LIST 100 image sensor
102 photodetector
104 vertical gate
106 vertical gate
108 vertical gate
110 vertical gate
111 vertical shift register region
112 horizontal shift register region
114 horizontal gate
116 horizontal gate
118 horizontal gate
120 horizontal gate
124 channel in vertical shift register region
126 channel in horizontal shift register region
128 overflow barrier region
130 overflow drain region
200 image capture device
202 light
204 imaging stage
206 image sensor
208 processor
210 memory
212 display
214 other I/O
300 photodetector
302 vertical CCD channel region
304 vertical gate
306 vertical gate
308 vertical gate
310 vertical gate
312 horizontal CCD channel region
314 horizontal gate
316 horizontal gate
318 horizontal gate
320 horizontal gate
322 overflow barrier region
324 buffer region
326 overflow drain region
328 conductive contact
330 conductive bus
332 power supply bias
400 shift element
402 first phase
404 second phase
406 third phase
408 fourth phase
410 arrow representing direction of charge transfer
500 well
502 surface of well
504 substrate
506 channel stop region
508 field oxide
600 barrier height

The invention claimed is:

1. A charge-coupled device (CCD) image sensor comprising:
an array of pixels each comprising a photodetector for conversion of incident light into electrical charge;
electrically connected to the array of pixels, a horizontal CCD channel region comprising a plurality of shift elements for receiving charge from the array of pixels and transferring the charge out of the array for conversion into an image, each shift element comprising a plurality of phases;
a plurality of distinct drains each associated with a different shift element and electrically connected to only one phase thereof;
a barrier region disposed between each drain and the phase to which the drain is connected, said barrier region having a barrier potential such that excess charge in the channel region that exceeds the barrier potential flows over the barrier region and is drained by the drain; and
a buffer region electrically connecting each drain and the phase to which the drain is connected.

2. The CCD image sensor of claim 1, further comprising a conductive bus electrically connected to all of the distinct drains.

3. The CCD image sensor of claim 2, wherein the conductive bus comprises a metal.

4. The CCD image sensor of claim 3, wherein the metal comprises at least one of aluminum or copper.

5. The CCD image sensor of claim 2, further comprising a source of power supply bias electrically connected to the conductive bus.

6. The CCD image sensor of claim 1, wherein the barrier potential has a height selected to prevent charge blooming from the phase into a component other than the drain.

7. The CCD image sensor of claim 1, wherein the buffer region spaces each drain away from the phase to which the drain is connected.

8. The CCD image sensor of claim 1, further comprising, for transferring charge from the pixels to the horizontal CCD channel region, a plurality of vertical CCD channel regions each electrically connected to (i) a plurality of pixels and (ii) the horizontal CCD channel region.

9. The CCD image sensor of claim 8, wherein each vertical CCD channel region comprises a plurality of phases, one of the phases being directly connected to the horizontal CCD channel region.

10. The CCD image sensor of claim 9, wherein, for each of the vertical CCD channel regions, the phase of the vertical CCD channel region directly connected to the horizontal CCD channel region is connected to the phase of the horizontal CCD channel region connected to one of the drains.

11. The CCD image sensor of claim 1, further comprising, electrically connected to the horizontal CCD channel region, circuitry for conversion of charge received from the horizontal CCD channel region into an image.

12. The CCD image sensor of claim 11, wherein the circuitry comprises an output amplifier.

13. A charge-coupled device (CCD) image sensor comprising:
- an array of pixels each comprising a photodetector for conversion of incident light into electrical charge;
- electrically connected to the array of pixels, a horizontal CCD channel region comprising a plurality of shift elements for receiving charge from the array of pixels and transferring the charge out of the array for conversion into an image, each shift element comprising a plurality of phases;
- a plurality of distinct drains each associated with a different shift element and electrically connected to only one phase thereof; and
- a plurality of distinct barrier regions with each barrier region being disposed between one of the drains and the phase to which the drain is connected, each barrier region having a barrier potential such that excess charge in the channel region that exceeds the barrier potential flows over the barrier region and is drained by the drain.

14. The CCD image sensor of claim 13, further comprising a conductive bus electrically connected to all of the distinct drains.

15. The CCD image sensor of claim 14, wherein the conductive bus comprises a metal.

16. The CCD image sensor of claim 15, wherein the metal comprises at least one of aluminum or copper.

17. The CCD image sensor of claim 14, further comprising a source of power supply bias electrically connected to the conductive bus.

18. The CCD image sensor of claim 13, wherein the barrier potential has a height selected to prevent charge blooming from the phase into a component other than the drain.

19. The CCD image sensor of claim 13, further comprising a buffer region electrically connecting each drain and the phase to which the drain is connected.

20. The CCD image sensor of claim 19 wherein the buffer region spaces each drain away from the phase to which the drain is connected.

21. The CCD image sensor of claim 13, further comprising, for transferring charge from the pixels to the horizontal CCD channel region, a plurality of vertical CCD channel regions each electrically connected to (i) a plurality of pixels and (ii) the horizontal CCD channel region.

22. The CCD image sensor of claim 21, wherein each vertical CCD channel region comprises a plurality of phases, one of the phases being directly connected to the horizontal CCD channel region.

23. The CCD image sensor of claim 22, wherein, for each of the vertical CCD channel regions, the phase of the vertical CCD channel region directly connected to the horizontal CCD channel region is connected to the phase of the horizontal CCD channel region connected to one of the drains.

24. The CCD image sensor of claim 13, further comprising, electrically connected to the horizontal CCD channel region, circuitry for conversion of charge received from the horizontal CCD channel region into an image.

25. The CCD image sensor of claim 24, wherein the circuitry comprises an output amplifier.

\* \* \* \* \*